United States Patent
Wang et al.

(10) Patent No.: US 8,125,838 B2
(45) Date of Patent: Feb. 28, 2012

(54) SYSTEM IN PACKAGE INTEGRATED CIRCUIT WITH SELF-GENERATING REFERENCE VOLTAGE

(75) Inventors: Shih-Hsing Wang, Hsinchu (TW); Der-Min Yuan, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 12/892,934

(22) Filed: Sep. 29, 2010

(65) Prior Publication Data

US 2011/0085388 A1     Apr. 14, 2011

(30) Foreign Application Priority Data

Oct. 9, 2009   (TW) ................................ 98134322 A

(51) Int. Cl.
*G11C 7/06* (2006.01)
(52) U.S. Cl. ............ 365/189.07; 365/189.09; 365/51
(58) Field of Classification Search .......... 365/189.07, 365/189.09, 51

See application file for complete search history.

(56) References Cited

U.S. PATENT DOCUMENTS 7,102,418 B2 * 9/2006 Nygren .................... 327/530

* cited by examiner

*Primary Examiner* — Huan Hoang
(74) *Attorney, Agent, or Firm* — Winston Hsu; Scott Margo

(57) ABSTRACT

This invention provides a system in package integrated circuit with self-generating reference voltage, in which includes a logic circuit chip and a memory chip. The logic circuit chip generates a plurality of output signals, and the memory chip includes a plurality of input circuit receiving the plurality of output signals from the logic circuit chip. The memory chip further includes a voltage generator generating an input reference voltage based on an output supply voltage. The memory chip is compatible with DDR standard and the plurality of input circuit thereof is compatible with SSTL_2 standard. Wherein, each input circuit comprises a comparator with a first input terminal receiving one of the plurality of output signals and a second input terminal receiving the input reference voltage.

9 Claims, 3 Drawing Sheets

SYSTEM IN PACKAGE INTEGRATED CIRCUIT WITH SELF-GENERATING REFERENCE VOLTAGE

BACKGROUND OF THE INVENTION

1. Field of the Invention

The present invention is related to a System in Package (SIP) integrated circuit, and more particularly, to a SIP integrated circuit which self-generates an input reference voltage.

2. Description of the Prior Art

As the development of the integrated circuit process advances, the capacity and the operational speed of the memory progress exponentially, for which various memory specifications are introduced successively. Double Data Rate (DDR) standard is a well known specification, and the relative DDR standard (such as the DDR standard of the JESD79 series formulated by the JEDEC association) is recited to assist explaining the present invention. In DDR standard, it is denoted that all inputs of DDR standard are compatible with the SSTL_2 standard, which is another standard developed by the JEDEC association. The SSTL_2 standard is also recited to assist the explanation of the present invention.

The purpose of the SSTL_2 standard is to regulate the 2.5 volt (V) interface standard of the digital integrated circuit, as shown in FIG. 1. FIG. 1 is a diagram illustrating an embodiment of a circuitry according to the SSTL_2 standard, wherein the output buffer 110 of the first digital integrated circuit 10 generates an output signal $V_{OUT}$, and the input circuit 210 of the second digital integrated circuit 20 receives the output signal $V_{OUT}$ and then generates an input signal for the second digital integrated circuit 20 to make use of, according to an input reference voltage VREF. For the output signal $V_{OUT}$ to maintain a decent signal waveform (i.e. decent signal integrity) during transmission, a serial resistor RS is coupled between the first digital integrated circuit 10 and the second digital integrated circuit 20, and one end of another terminal resistor RT is coupled between the serial resistor RS and the second digital integrated circuit 20, wherein the other end of the terminal resistor RT is coupled to a terminal voltage VTT. In this embodiment, the serial resistor RS and the terminal resistor RT are realized with resistors of 25 Ohms and 50 Ohms, respectively. Generally, the input circuit 210 is of a comparator, in which one input end receives the input reference voltage VREF and the other input end receives the output signal $V_{OUT}$ generated from the first digital integrated circuit 10. For the first digital integrated circuit 10 and the second digital integrated circuit 20 to utilize the similar input reference voltage VREF, the input reference voltage VREF required by the input circuit 210 is generally generated directly from the first digital integrated circuit 10.

In practical applications, the DDR memory chip is often composed into the system in package with another logic circuit chip, as shown in FIG. 2A and FIG. 2B. FIG. 2A is a diagram illustrating a stack packaging technique utilized in the SIP, wherein the DDR memory chip 310 is disposed onto the logic circuit chip 320 and the stack chip set (i.e. DDR memory chip 310 plus the logic circuit chip 320) is then disposed onto the base board 330. The relative input/output (I/O) pins of the DDR memory chip 310, the logic circuit chip 320 and the base board are subsequently wire bonded. FIG. 2B is a diagram illustrating another structure of SIP, wherein the DDR memory chip 310 and the logic circuit chip 320 are disposed respectively onto the base board 330, the relative input/output (I/O) pins of the DDR memory chip 310 and the logic circuit chip 320 are then wire bonded to the external connection pins of the base board 330. However, the integrated circuits of such SIP mentioned above are somewhat flawed; for instances, there are times when the selected logic circuit chip 320 is unable to provide the input reference voltage VREF for the DDR memory chip 310 to use; or the output pin of the logic circuit chip 320 providing the input reference voltage VREF is not located on the same side as the input pin of the DDR memory chip 310 receiving the input reference voltage VREF, increasing the difficulty/complexity of the wiring bonding.

SUMMARY OF THE INVENTION

The present invention discloses a system in package (SIP) integrated circuit which self-generates an input reference voltage. The SIP integrated circuit comprises a logic circuit chip and a memory chip. The logic circuit chip comprises a plurality of output pins for generating a plurality of output signals. The memory chip comprises a plurality of input circuits for receiving the plurality of output signals generated by the logic circuit chip. Further the memory chip comprises a voltage generator which generates the input reference voltage according to an external voltage. Each input circuit of the memory chip comprises a comparator, the comparator comprises a first input end and a second input end, the first input end receives an output signal out of the plurality of the output signals, the second input end receives the input reference voltage generated from the voltage generator of the memory chip, the comparator generates an input signal for the memory chip according to the output signal and the input reference voltage, and the memory chip is compatible to a DDR standard.

These and other objectives of the present invention will no doubt become obvious to those of ordinary skill in the art after reading the following detailed description of the preferred embodiment that is illustrated in the various figures and drawings.

DETAILED DESCRIPTION

Therefore, the present invention discloses a system in package integrated circuit which self-generates the reference voltage, which comprises a logic circuit chip and a memory chip, wherein the memory chip is compatible with the DDR standard. The memory chip, however, is able to self-generate the input reference voltage for a plurality of the input circuits of the memory chip, so the logic circuit chip does not require generating the input reference voltage for the memory chip.

Figure 3:
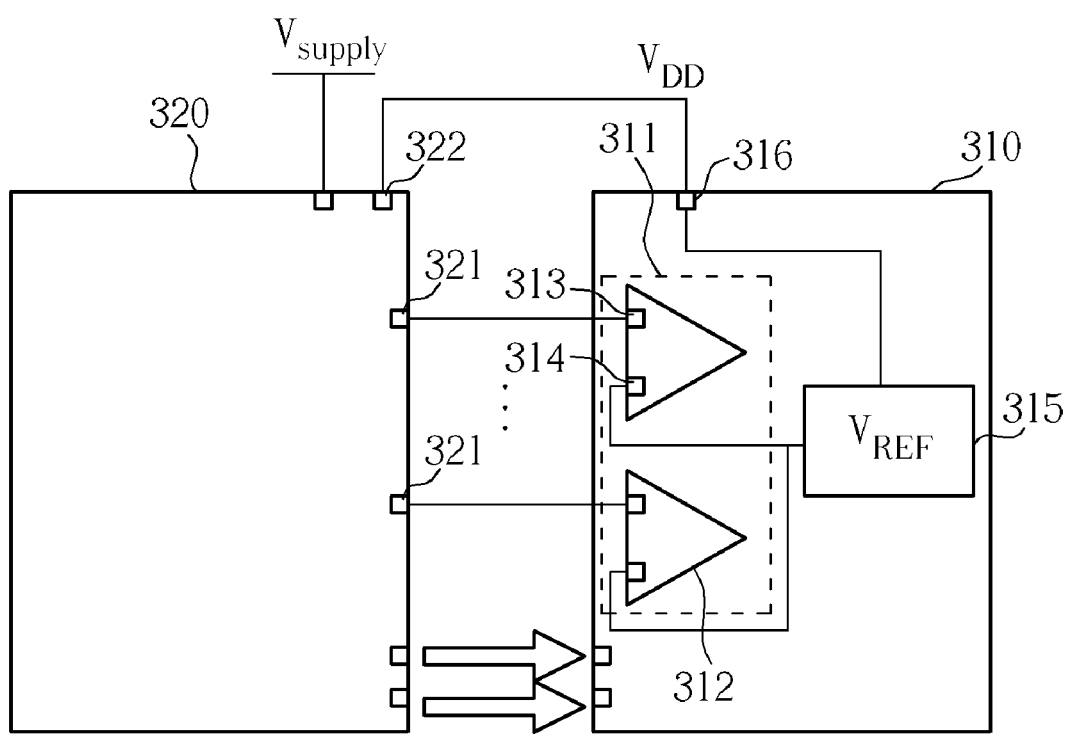
FIG. 3 is a diagram illustrating the SIP integrated circuit which self-generates the input reference voltage according to an embodiment of the present invention.

Please refer to FIG. 3. FIG. 3 is a diagram illustrating the System in Package (SIP) integrated circuit which self-generates the input reference voltage according to an embodiment of the present invention. The SIP integrated circuit comprises a memory chip 310 and a logic circuit chip 320. The memory chip comprises a plurality of input circuits 311 and in this embodiment, each of the input circuits 311 comprises a comparator 312. The comparator 312 comprises a first input end 313 and a second input end 314. The memory chip 310 further comprises a voltage generator 315, which generates the input reference voltage VREF to the second input end of each comparator 312 according to an external voltage VDD.

The logic circuit chip 320 comprises a plurality of output pins 321 for correspondingly generating a plurality of output signals. The plurality of output signals are transmitted to the plurality of input circuits 311 of the memory chip 310. For instances, the first input end 313 of every comparator 312 receives an output signal. The logic circuit chip 320 further comprises a voltage output pin 322 for providing the external voltage VDD of the logic circuit chip 320 to the voltage input pin 316 of the memory chip 310. This way, the voltage generator 315 can then generate the input reference voltage VREF according to the external voltage VDD, so as to provide the input reference voltage VREF to the second input end 314 of each comparator 315. In this embodiment, the voltage level of the input reference voltage VREF is approximately half of the voltage level of the external voltage VDD. The voltage required by the logic circuit chip 320 is provided by another external voltage source Vsupply.

In the present embodiment, the memory chip 310 is compatible to the DDR standard and the plurality of the input circuits 311 of the memory chip 310 is compatible to the SSTL_2 standard. The high and low voltage level of the input signal generated by the comparator 312 is approximately 2.5V and 0V respectively. The first input end 313 of each comparator 312 receives the output signal generated by the logic circuit chip 320, and the input reference voltage VREF required by the second input end 314 of each comparator 312 is self-generated by the memory chip 310. In other words, the input reference voltage VREF is not provided by the logic circuit chip 320, but the voltage generator 315 of the memory chip 310. This way, instead of requiring the input reference voltage to be generated from the logic circuit chip, the comparator directly utilizes the input reference voltage VREF generated by the memory chip, consequently increasing the packaging flexibility due to less wire bonding is required in the SIP integrated circuit. The comparator 312 generates the input signal according to the input reference voltage VREF and an output signal generated by the logic circuit chip 320. The input signal generated by the comparator 312 is of a data input signal (which is different from signals such as the control input signal or the address input signal), to be stored in the memory chip 310.

Figure 1:
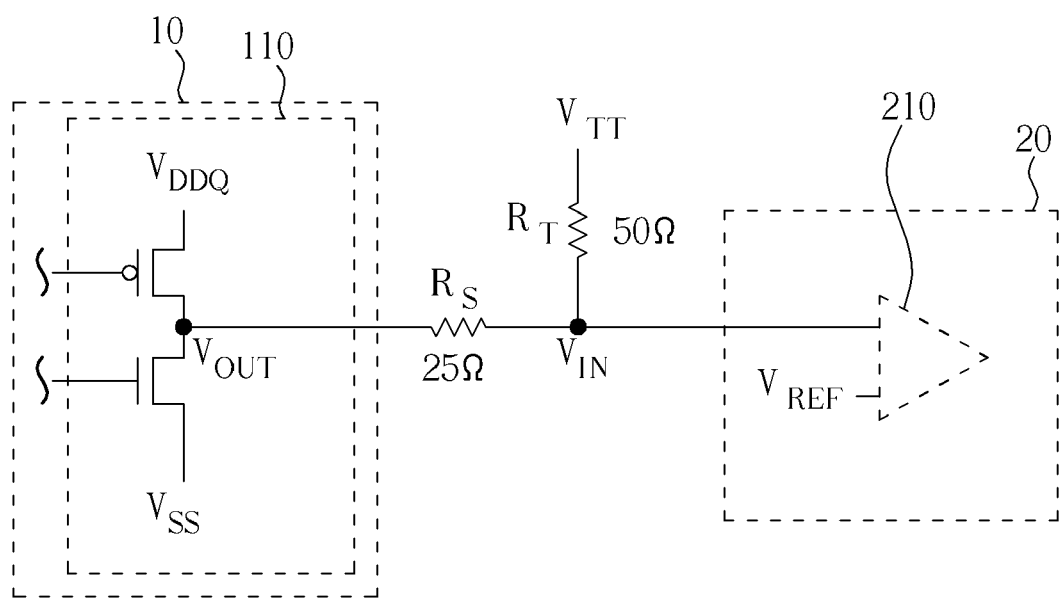
FIG. 1 is a diagram illustrating an embodiment of a circuitry according to the SSTL_2 standard.

Furthermore, in another embodiment of the present invention, the plurality of output pins 321 of the logic circuit chip 320 and the plurality of input circuits 311 of the memory chip 310 are directly coupled via a plurality of wires, without requiring the serial resistor RS and the terminal resistor RT illustrated in FIG. 1. This is due to that the logic circuit chip 320 is relatively close to the memory chip 310, so even though the serial resistor RS and the terminal resistor RT are not present, the output signal generated by the logic circuit chip 320 should not be attenuated much; hence reducing the components used and the cost of the packaging.

Figure 2B:
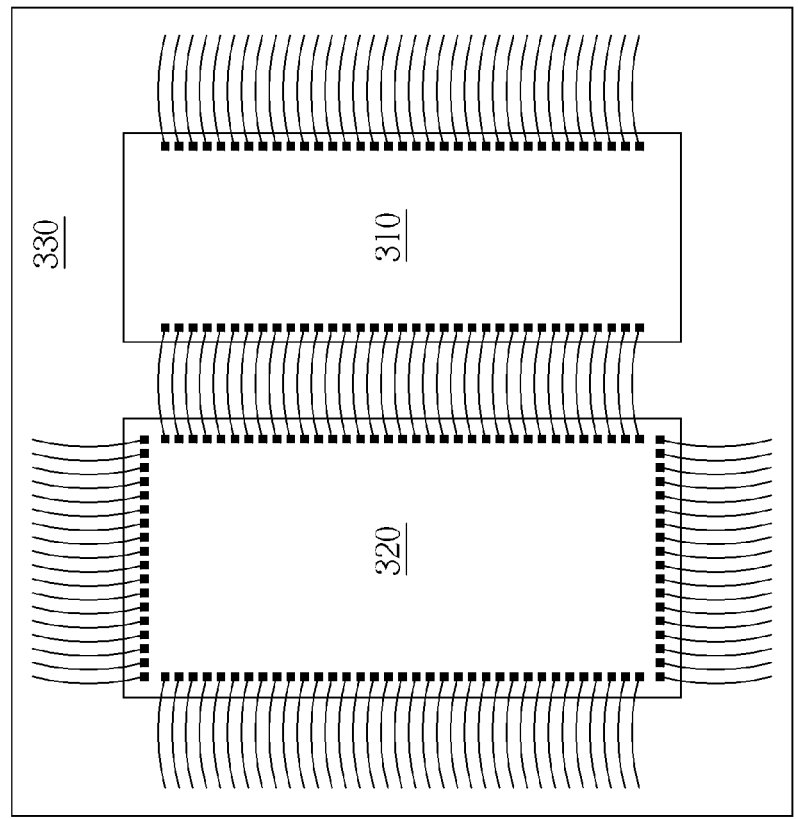
FIG. 2B is a diagram illustrating another structure of SIP.
Figure 2A:
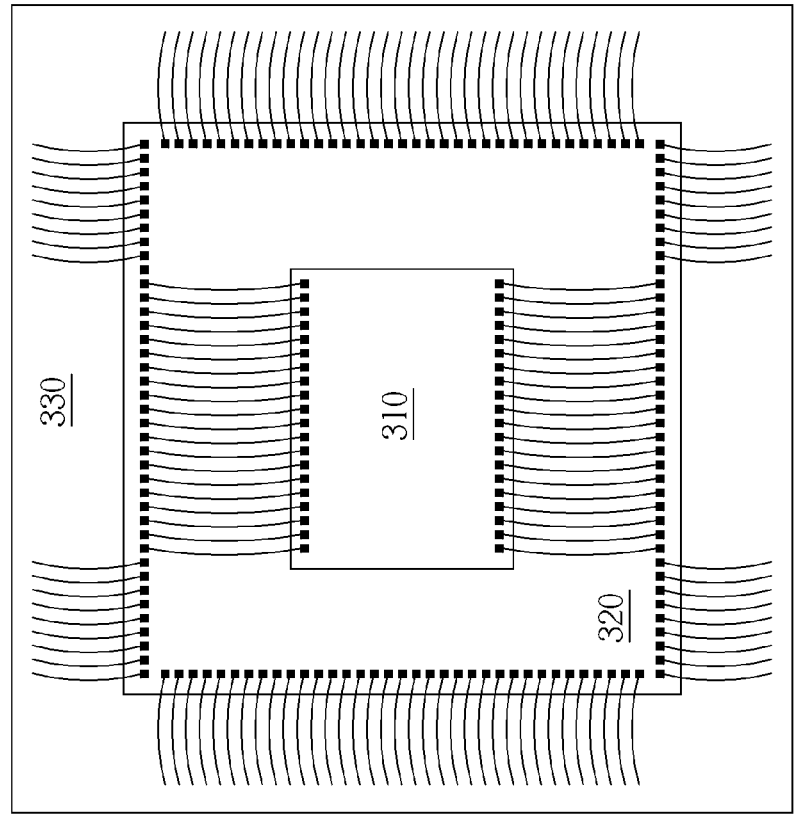
FIG. 2A is a diagram illustrating a stack packaging technique utilized in the System in Package (SIP).

The SIP integrated circuit of the present invention disposes the DDR memory chip 310 onto the logic circuit chip 320 in a similar way illustrated in FIG. 2A, and then the stacked chip (DDR memory chip 310 plus the logic circuit chip 320) is disposed onto the base board (not shown in FIG. 3). The relative I/O pins of the DDR memory chip 310 and the logic circuit chip 320 are coupled to the external connection pins of the base board 330 according to the above mentioned embodiments, and a sealant is utilized to coat the memory chip, the logic circuit chip and the base board. Also, the SIP integrated circuit of the present invention disposes the DDR memory chip 310 and the logic circuit chip 320 onto the logic circuit chip 320 respectively in a similar way illustrated in FIG. 2B. The relative I/O pins of the DDR memory chip 310 and the logic circuit chip 320 are coupled to the external connection pins of the base board 330 according to the above mentioned embodiments, and then a sealant is utilized to coat the memory chip, the logic circuit chip and the base board. Other than utilizing wires for bonding, the present invention can also utilize flip-chip method for realizing the relative connections for the I/O pins of the DDR memory chip 310 and the logic circuit chip 320, as well as the external connection pins of the base board 330.

In conclusion, the memory chip of the SIP integrated circuit which self-generates the input reference voltage is compatible with the DDR standard, and the input reference voltage required by the plurality of input circuits of the memory chip is not generated from the logic circuit chip, but self-generated from the memory chip. This prevents the issue of when the selected logic circuit chip is unable to provide the input reference voltage VREF to the DDR memory chip; this also decreases the difficulty/complexity of wire bonding, as the output pins of the logic circuit chip providing the input reference voltage VREF and the input pins of the DDR memory chip receiving the input reference voltage VREF are not necessary to be located on the same side.

Those skilled in the art will readily observe that numerous modifications and alterations of the device and method may be made while retaining the teachings of the invention.

What is claimed is:

1. A system in package (SIP) integrated circuit which self-generates an input reference voltage, comprising:
a logic circuit chip, comprising a plurality of output pins for generating a plurality of output signals, the logic circuit chip receiving a first external voltage; and
a memory chip, comprising a plurality of input circuits for receiving the plurality of output signals generated by the logic circuit chip, the memory chip further comprising a voltage generator which generates the input reference voltage according to a second external voltage provided to the voltage generator of the memory chip from the logic circuit chip, the second external voltage being different from the first external voltage;
wherein each input circuit of the memory chip comprises a comparator, the comparator comprises a first input end and a second input end, the first input end receives an output signal out of the plurality of the output signals, the second input end receives the input reference voltage generated from the voltage generator of the memory chip, the comparator generates an input signal for the memory chip according to the output signal and the input reference voltage, and the memory chip is compatible to a DDR standard.

2. The SIP integrated circuit of claim 1, wherein the plurality of input circuits of the memory chip is compatible to a SSTL_2 standard.

3. The SIP integrated circuit of claim 1, wherein the plurality of output pins of the logic circuit chip is directly coupled to the plurality of the input circuits of the memory chip via a plurality of wires.

4. The SIP integrated circuit of claim 3, wherein each of the plurality of the wires is not coupled to a terminal resistor.

5. The SIP integrated circuit of claim 1, wherein a voltage level of the second external voltage is approximately twice as a voltage level of the input reference voltage.

6. The SIP integrated circuit of claim 1, wherein the comparator generates a first voltage level of the input signal to be approximately 2.5 volt.

7. The SIP integrated circuit of claim 6, wherein the input signal generated by the comparator is a data input signal to be stored in the memory chip.

8. The SIP integrated circuit of claim 1, wherein the memory chip is disposed onto the logic circuit chip and SIP integrated circuit further comprises a sealant for coating the memory chip and the logic circuit chip.

9. The SIP integrated circuit of claim 1, wherein the memory chip and the logic circuit chip are disposed respectively onto a base board, and the SIP integrated circuit further comprises a sealant for coating the memory chip, the logic circuit chip and the base board.

* * * * *